United States Patent
Brodie (10) Patent No.: US 10,497,536 B2
(45) Date of Patent: Dec. 3, 2019

(54) APPARATUS AND METHOD FOR CORRECTING ARRAYED ASTIGMATISM IN A MULTI-COLUMN SCANNING ELECTRON MICROSCOPY SYSTEM

(71) Applicant: KLA-Tencor Corporation, Milpitas, CA (US)

(72) Inventor: Alan D. Brodie, Palo Alto, CA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 15/645,863

(22) Filed: Jul. 10, 2017

(65) Prior Publication Data

US 2018/0068825 A1    Mar. 8, 2018

Related U.S. Application Data (60) Provisional application No. 62/385,084, filed on Sep. 8, 2016.

(51) Int. Cl.
*H01J 37/153* (2006.01)
*G01N 23/2251* (2018.01)
*H01J 37/28* (2006.01)

(52) U.S. Cl.
CPC ........ *H01J 37/153* (2013.01); *G01N 23/2251* (2013.01); *H01J 37/28* (2013.01); *H01J 2237/2813* (2013.01)

(58) Field of Classification Search
CPC ...... H01J 37/153; H01J 37/28; H01J 37/3178; G01N 23/2813
See application file for complete search history.

(56) References Cited

U.S. PATENT DOCUMENTS

| | | | |
|---|---|---|---|
| 5,834,783 A * | 11/1998 | Muraki | B82Y 10/00 250/398 |
| 2004/0140438 A1 | 7/2004 | Gerlach et al. | |
| 2009/0321634 A1 | 12/2009 | Khursheed | |
| 2010/0320382 A1 | 12/2010 | Almogy et al. | |
| 2011/0068276 A1 * | 3/2011 | Kruit | B82Y 10/00 250/396 R |
| 2012/0061565 A1 * | 3/2012 | Enyama | H01J 37/265 250/307 |
| 2012/0241606 A1 * | 9/2012 | Han | G01N 23/2251 250/307 |
| 2015/0213998 A1 | 7/2015 | Winkler et al. | |
| 2016/0284505 A1 * | 9/2016 | Ren | H01J 37/28 |

* cited by examiner

*Primary Examiner* — Eliza W Osenbaugh-Stewart
(74) *Attorney, Agent, or Firm* — Suiter Swantz pc llo (57) ABSTRACT

A multi-beam scanning electron microscopy (SEM) system is disclosed. The system includes an electron beam source configured to generate a source electron beam. The system includes a set of electron-optical elements configured to generate a flood electron beam from the source electron beam. The system includes a multi-beam lens array with a plurality of electron-optical pathways configured to split the flood electron beam into a plurality of primary electron beams, and a plurality of electrically-charged array layers configured to adjust at least some of the plurality of primary electron beams. The system includes a set of electron-optical elements configured to direct at least some of the plurality of primary electron beams onto a surface of a sample secured by a stage. The system includes a detector array configured to detect a plurality of electrons emanated from the surface of the sample in response to the plurality of primary electron beams.

12 Claims, 7 Drawing Sheets

APPARATUS AND METHOD FOR CORRECTING ARRAYED ASTIGMATISM IN A MULTI-COLUMN SCANNING ELECTRON MICROSCOPY SYSTEM

CROSS-REFERENCE TO RELATED APPLICATIONS

The present application claims priority under 35 U.S.C. § 119(e) to U.S. Provisional Patent Application Ser. No. 62/385,084, filed Sep. 8, 2016, entitled ARRAYED ASTIGMATISM CORRECTION, naming Alan Brodie as inventor, which is incorporated herein by reference in the entirety.

TECHNICAL FIELD

The present invention generally relates to wafer inspection and review, and more particularly, to correcting arrayed astigmatism in a scanning electron microscopy system for use during wafer and photomask/reticle inspection and review.

BACKGROUND

The fabrication of semiconductor devices, such as logic and memory devices, typically includes processing a semiconductor device using a large number of semiconductor fabrication processes to form various features and multiple levels of the semiconductor devices. Some fabrication processes utilize photomasks/reticles to print features on a semiconductor device such as a wafer. As semiconductor devices become smaller and smaller, it becomes critical to develop enhanced inspection and review devices and procedures to increase the resolution, speed, and throughput of wafer and photomask/reticle inspection processes.

One inspection technology includes electron beam based inspection such as scanning electron microscopy (SEM). In some instances, scanning electron microscopy is performed via an SEM system which includes an increased number of electron-optical columns (e.g. a multi-column SEM system). In other instances, scanning electron microscopy is performed via secondary electron beam collection (e.g. a secondary electron (SE) imaging system). In other instances, scanning electron microscopy is performed by splitting a single electron beam into numerous beams and utilizing a single electron-optical column to individually tune and scan the numerous beams (e.g. a multi-beam SEM system).

Splitting the single electron beam into numerous beams for a multi-beam SEM system traditionally requires an array of aperture lenses and/or micro-lenses. The array of aperture lenses and/or micro-lenses are set in small, electrically-charged apertures (e.g. less than 100 µm in diameter) that are substantially round in design to create lens fields. If the apertures are out-of-round, astigmatism is introduced in the lens fields which results in a distorted image plane.

Therefore, it would be advantageous to provide a system that cures the shortcomings described above.

SUMMARY

A multi-beam scanning electron microscopy (SEM) system is disclosed, in accordance with one or more embodiments of the present disclosure. In one embodiment, the system includes an electron beam source configured to generate a source electron beam. In another embodiment, the system includes a first set of electron-optical elements configured to generate a flood electron beam from the source electron beam. In another embodiment, the system includes a multi-beam lens array. In another embodiment, the multi-beam lens array includes a plurality of electron-optical pathways configured to split the flood electron beam into a plurality of primary electron beams. In another embodiment, the multi-beam lens array includes a plurality of electrically-charged array layers configured to adjust at least some of the plurality of primary electron beams. In another embodiment, the system includes a second set of electron-optical elements configured to direct at least some of the plurality of primary electron beams onto a surface of a sample. In another embodiment, the system includes a stage configured to secure the sample. In another embodiment, the system includes a detector array configured to detect a plurality of electrons emanated from the surface of the sample in response to the plurality of primary electron beams.

An apparatus for correcting arrayed astigmatism in a multi-beam scanning electron microscopy (SEM) system is disclosed, in accordance with one or more embodiments of the present disclosure. In one embodiment, the apparatus includes a plurality of electron-optical pathways configured to split a flood electron beam to generate a plurality of primary electron beams. In another embodiment, the flood electron beam is generated via a first set of electron-optical elements from a source electron beam. In another embodiment, the source electron beam is generated via an electron beam source. In another embodiment, the apparatus includes a plurality of electrically-charged array layers configured to adjust at least some of the plurality of primary electron beams. In another embodiment, at least some of the plurality of primary electron beams are directed onto a surface of a sample via a second set of electron-optical elements. In another embodiment, a plurality of electrons emanate from the surface of the sample in response to the plurality of primary electron beams. In another embodiment, the plurality of electrons are detected by a detector array.

A method is disclosed, in accordance with one or more embodiments of the present disclosure. In one embodiment, the method may include, but is not limited to, generating a source electron beam. In another embodiment, the method may include, but is not limited to, generating a flood electron beam from the source electron beam via a first set of electron-optical elements. In another embodiment, the method may include, but is not limited to, splitting the flood electron beam to generate a plurality of primary electron beams via a multi-beam lens array. In another embodiment, the method may include, but is not limited to, adjusting at least some of the plurality of primary electron beams via the multi-beam lens array. In another embodiment, the method may include, but is not limited to, directing at least some of the plurality of primary electron beams through a second set of electron-optical elements onto a surface of a sample. In another embodiment, the method may include, but is not limited to, detecting a plurality of electrons emanated from the surface of the sample in response to the plurality of primary electron beams.

It is to be understood that both the foregoing general description and the following detailed description are exemplary and explanatory only and are not necessarily restrictive of the present disclosure. The accompanying drawings, which are incorporated in and constitute a part of the characteristic, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1-5, an apparatus and method for correcting arrayed astigmatism in a multi-column scanning electron microscopy (SEM) system is disclosed, in accordance with the present disclosure.

Embodiments of the present disclosure are directed to a scanning electron microscopy (SEM) system including a multi-beam lens array. Additional embodiments of the present disclosure are directed to correcting astigmatism in the SEM system due to aperture shape variance in a multi-beam lens array via one or more multi-pole beam deflectors within the multi-beam lens array. Additional embodiments of the present disclosure are directed to correcting astigmatism in the SEM system due to aperture shape variance in a multi-beam lens array via one or more sets of slitted beam stigmators within the multi-beam lens array.

Figure 1:
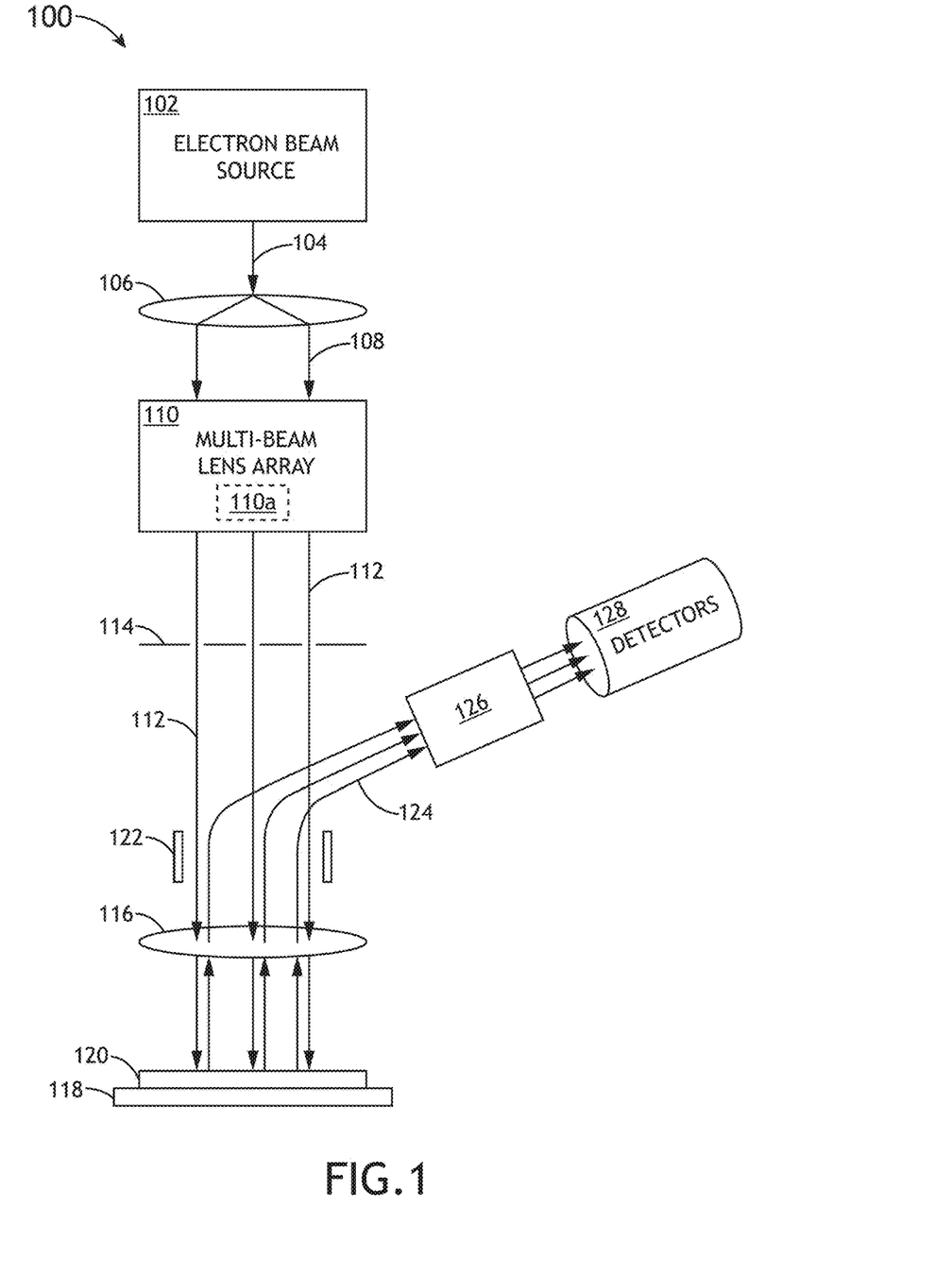
FIG. 1 illustrates a simplified schematic view of a scanning electron microscopy (SEM) system equipped with a multi-beam lens array, in accordance with one or more embodiments of the present disclosure.

FIG. 1 illustrates a scanning electron microscopy (SEM) system 100, in accordance with one or more embodiments of the present disclosure. In one embodiment, the system 100 is a multi-beam SEM system. While the present disclosure largely focuses on an electron-optical arrangement associated with a multi-beam SEM system, it is noted herein that this should not be interpreted as a limitation on the scope of the present disclosure but merely an illustration. It is additionally noted herein that the embodiments described throughout the present disclosure may be extended to any electron-optical system configuration.

In one embodiment, the system 100 includes an electron beam source 102. In another embodiment, the electron beam source 102 generates a source electron beam 104, and directs the source electron beam 104 through a set of electron-optical elements 106.

In another embodiment, the set of electron-optical elements 106 widens the source electron beam 104 to generate a flood electron beam 108, and directs the flood electron beam 108 through a multi-beam lens array 110. In another embodiment, the multi-beam lens array 110 includes one or more electron-optical pathways 110a to generate and adjust one or more primary electron beams 112.

In another embodiment, the system 100 includes an intermediate image plane 114. In another embodiment, the system 100 includes set of electron-optical elements 116.

The set of electron-optical elements 116 may include any electron-optical element suitable for focusing, suppressing, extracting, and/or directing the one or more primary electron beams 112. For example, the set of electron-optical elements 116 may include, but is not limited to, an objective lens. For instance, the objective lens may focus and/or direct the one or more primary electron beams 112 onto a surface of the sample 120. In another embodiment, the multi-beam lens array 110 directs the one or more primary electron beams 112 through the intermediate image plane 114 and via the objective lens 116 onto the surface of the sample 120.

In another embodiment, the system 100 includes a sample stage 118 configured to secure a sample 120. The sample stage 118 may include any sample stage known in the art of electron-beam microscopy. In one embodiment, the sample stage 118 is an actuatable stage. For example, the sample stage 118 may include, but is not limited to, one or more translational stages suitable for selectably translating the sample 120 along one or more linear directions (e.g., x-direction, y-direction and/or z-direction). By way of another example, the sample stage 118 may include, but is not limited to, one or more rotational stages suitable for selectively rotating the sample 120 along a rotational direction. By way of another example, the sample stage 118 may include, but is not limited to, a rotational stage and a translational stage suitable for selectably translating the sample along a linear direction and/or rotating the sample 120 along a rotational direction.

The sample 120 includes any sample suitable for inspection/review with electron-beam microscopy. In one embodiment, the sample includes a wafer. For example, the sample may include, but is not limited to, a semiconductor wafer. As used through the present disclosure, the term "wafer" refers to a substrate formed of a semiconductor and/or a non-semiconductor material. For instance, in the case of a semiconductor material, the wafer may be formed from, but is not limited to, monocrystalline silicon, gallium arsenide, and/or indium phosphide. In another embodiment, the sample includes a photomask/reticle.

In one embodiment, the sample 120 emanates electrons 124 in response to the one or more primary electron beams 112. For example, the electrons 124 may include secondary electrons emitted from the surface of the sample 120. By way of another example, the electrons 124 may include backscattered electrons scattered by the surface of the sample 120.

In another embodiment, the secondary electrons are directed via a deflector assembly 122 along an electron-optical pathway offset from the electron-optical pathway of the one or more primary electron beams 112. For example, the deflector assembly 122 may include, but is not limited to, a Wien filter, a magnetic prism, or the like.

In another embodiment, the secondary electrons are directed via the set of electron-optical elements 126 to the detector array 128. The set of electron-optical elements 126 may include any electron-optical element known in the art suitable for focusing, suppressing, extracting, and/or directing the secondary electrons. The detector array 128 may include any type of secondary electron detector assembly known in the art. For example, the secondary electrons may be collected and imaged using an Everhart-Thornley detector (or other type of scintillator-based detector). In another embodiment, secondary electrons may be collected and imaged using a micro-channel plate (MCP). In another embodiment, electrons may be collected and imaged using a PIN or p-n junction detector, such as a diode or a diode array. In another embodiment, electrons may be collected and imaged using one or more avalanche photo diodes (APDs).

In another embodiment, the backscattered electrons are not directed by the deflector assembly 122 (e.g. a Wien filter, a magnetic prism, or the like). For example, the backscattered electrons are collected and imaged by a detector array 128 including one or more backscattered electron detector assemblies in the electron-optical pathway of the one or more primary electron beams 112. The one or more backscattered electron detector assemblies may include any type of backscattered electron detector assembly known in the art.

In one embodiment, the SEM system 100 includes a controller. In another embodiment, the controller is communicatively coupled to one or more components of the SEM system 100. For example, the controller may be communicatively coupled to the electron beam source 102, the multi-beam lens array 110, the sample stage 118, and/or the detector array 128. In this regard, the controller may direct any of the components of the SEM system 100 to carry out any one or more of the various functions described throughout the present disclosure. In another embodiment, the controller includes one or more processors and memory. The memory may store one or more sets of program instructions. The one or more processors may be configured to execute the one or more sets of program instructions to carry out one or more of the various steps described throughout the present disclosure.

The controller may be configured to receive and/or acquire data or information from other systems or subsystems (e.g., one or more sets of information from the electron beam source 102, the multi-beam lens array 110, the sample stage 118, and/or the detector array 128) of the SEM system 100 by a transmission medium that may include wireline and/or wireless portions. The controller may additionally be configured to transmit data or information (e.g., the output of one or more procedures of the inventive concepts disclosed herein) to one or more systems or subsystems (e.g., one or more sets of information from the electron beam source 102, the multi-beam lens array 110, the sample stage 118, and/or the detector array 128) of the SEM system 100 by a transmission medium that may include wireline and/or wireless portions. In this regard, the transmission medium may serve as a data link between the controller and the other subsystems of the SEM system 100. Additionally, the controller may be configured to send data to external systems via a transmission medium (e.g., network connection).

The one or more processors may include any one or more processing elements known in the art. In this sense, the one or more processors may include any microprocessor device configured to execute algorithms and/or program instructions. For example, the one or more processors may consist of a desktop computer, mainframe computer system, workstation, image computer, parallel processor, handheld computer (e.g. tablet, smartphone, or phablet), or other computer system (e.g., networked computer) configured to cause the SEM system 100 to perform one or more of the various steps described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute the one or more sets of program instructions from a non-transitory memory medium (e.g., the memory). Moreover, different subsystems of the SEM system 100 (e.g., one or more sets of information from the electron beam source 102, the multi-beam lens array 110, the sample stage 118, and/or the detector array 128) may include processor or logic elements suitable for carrying out at least a portion of the steps described throughout the present disclosure. Therefore, the above description should not be interpreted as a limitation on the present disclosure but merely an illustration.

The memory may include any storage medium known in the art suitable for storing the one or more sets of program instructions executable by the associated one or more processors to carry out the various steps described throughout the present disclosure. For example, the memory may include a non-transitory memory medium. For instance, the memory may include, but is not limited to, a read-only memory, a random access memory, a magnetic or optical memory device (e.g., disk), a magnetic tape, a solid state drive, and the like. The memory may be configured to provide display information to a display device of a user interface and/or the output of the various steps described throughout the present disclosure. The memory may additionally be configured to store user input information from a user input device of the user interface and/or the input from the various steps described throughout the present disclosure. The memory may be housed in a common controller housing with the one or more processors. The memory may, alternatively or in addition, be located remotely with respect to the physical location of the processors and/or the controller. For instance, the one or more processors and/or the controller may access a remote memory (e.g., server), accessible through a network (e.g., internet, intranet and the like).

In one embodiment, the electron beam source 102 may be coupled to a set of positioners configured to actuate the electron beam source 102 in one or more directions. For example, the controller may direct the set of positioners to translate the electron beam source 102 in one or more of an x-direction, a y-direction, and/or a z-direction to correct beam misalignment produced by any of the components of the SEM system 100.

Figure 2:
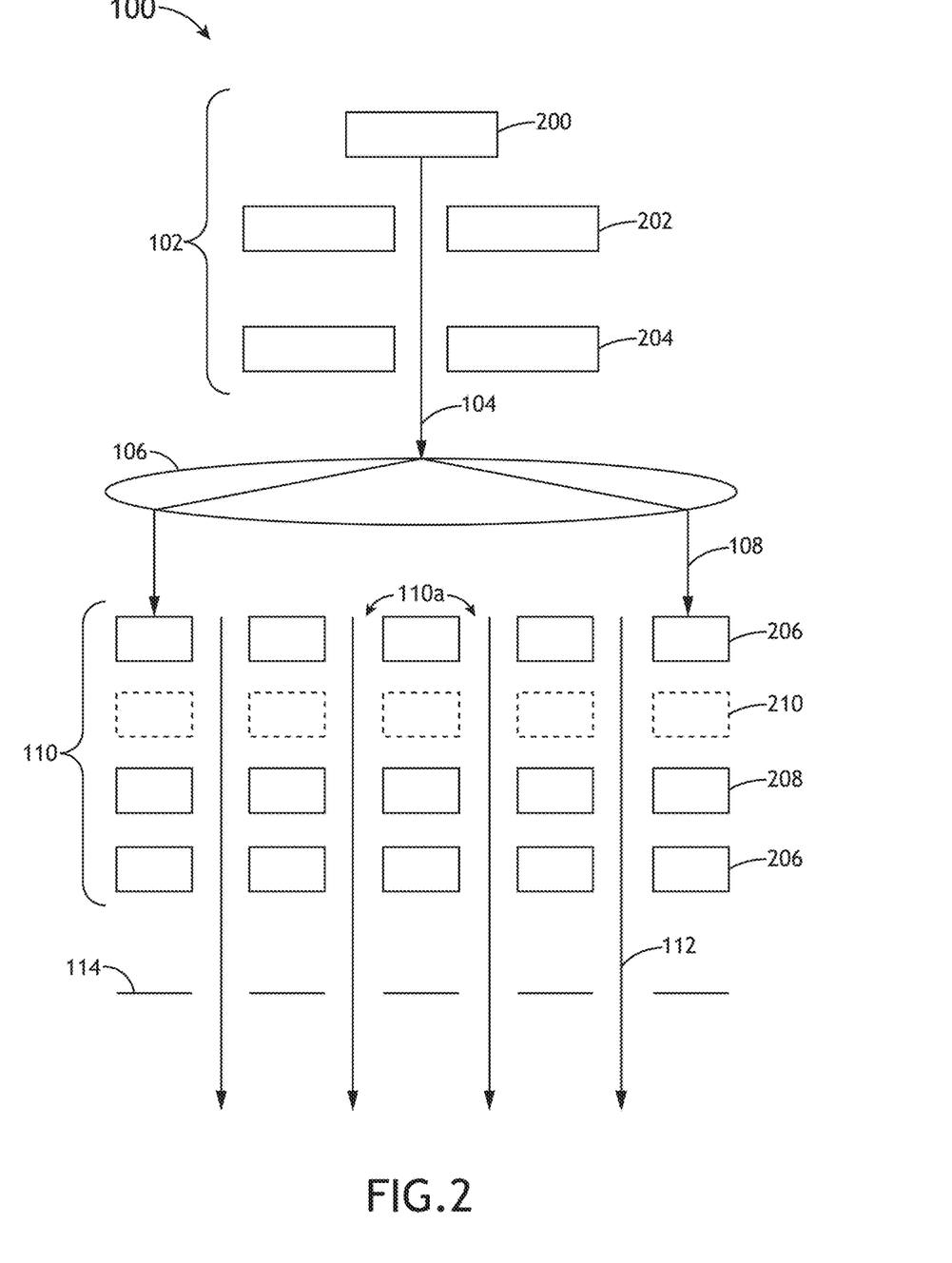
FIG. 2 illustrates a simplified schematic view of an electron beam source and a multi-beam lens array of a scanning electron microscopy (SEM) system equipped with a multi-beam lens array, in accordance with one or more embodiments of the present disclosure.

FIG. 2 illustrates the electron beam source 102 and the multi-beam lens array 110 of the SEM system 100, in accordance with one or more embodiments of the present disclosure.

The electron beam source 102 may include any electron beam source known in the art suitable for generating the source electron beam 104. In another embodiment, the electron beam source 102 includes an electron emitter 200. The electron emitter 200 may operate at a selected voltage. For example, the electron emitter 200 may operate at a voltage ranging from 0 Volts (V) to −45 kV. For instance, the electron emitter 200 may operate at a voltage of −30 kV. The electron emitter 200 may include any electron emitter known in the art. For example, the electron emitter 200 may include, but is not limited to, a field emission gun (FEG). For instance, the FEG may include, but is not limited to, a Schottky-type emitter, a carbon nanotube (CNT) emitter, a nanostructured carbon film emitter, or a Muller-type emitter. By way of another example, the electron emitter 200 may include, but is not limited to, a photocathode emitter or a silicon emitter.

In another embodiment, the electron beam source 102 includes an extractor 202 (or an extractor electrode). The extractor 202 may operate at a selected voltage. For example, the extractor 202 may operate at a voltage ranging from 0 V to −15 kV. For instance, the extractor 202 may operate at a voltage ranging from −3 kV to −10 kV. The extractor 202 may include any electron beam extractor configuration known in the art. For example, the extractor 202 may include, but is not limited to, a planar extractor or a non-planar extractor.

In another embodiment, the electron beam source 102 includes an anode 204. The anode 204 may operate at a selected voltage. For example, the anode 204 may operate at 0 V.

Although embodiments of the present disclosure are directed to a single electron beam source 102, it is noted herein that the SEM system 100 may include multiple electron beam sources 102 for generating multiple source electron beams 104, where the multiple electron beam sources 102 generate a separate source electron beam 104. Therefore, the above description should not be interpreted as a limitation on the scope of the present disclosure but merely an illustration.

The set of electron-optical elements 106 may include any electron-optical element known in the art suitable for focusing, suppressing, extracting, and/or directing the source electron beam 104. For example, the set of electron-optical elements 106 may include, but is not limited to, one or more electrostatic lenses and/or one or more magnetic lenses. In another embodiment, the set of electron-optical elements 106 generates the flood electron beam 108 from the source electron beam 104 and directs the flood electron beam 108, such that it illuminates a top surface of the multi-beam lens array 110.

In another embodiment, the multi-beam lens array 110 includes one or more electrically-charged layers. In another embodiment, the one or more electrically-charged layers include one or more sets of aligned apertures, which form the one or more electron-optical pathways 110a. In another embodiment, one or more aperture lenses or micro-lenses are inset within the one or more sets of aligned apertures forming the one or more electron-optical pathways 110a. For example, the one or more aperture lenses or micro-lenses may be individually adjustable. By way of another example, the one or more aperture lenses or micro-lenses may be globally adjustable (e.g. adjustable as a set). In another embodiment, the flood electron beam 108 illuminating the top surface of the multi-beam lens array 110 enters the one or more electron-optical pathways 110a. In this regard, the multi-beam lens array 110 splits the flood electron beam 108 into the one or more primary electron beams 112.

In another embodiment, the one or more array layers are electrically-charged. In another embodiment, the one or more array layers include one or more electrically-charged plates. In another embodiment, the one or more electrically-charged plates include one or more common voltage plates 206. For example, the one or more electrically-charged plates may include two common voltage plates 206. In another embodiment, the one or more common voltage plates 206 are grouped together into sets of common voltage plates. For example, a set of common voltage plates may include, but is not limited to, two common voltage plates 206. In another embodiment, the sets of common voltage plates share a common voltage plate 206. In another embodiment, the sets of common voltage plates are separate from other sets of common voltage plates.

The one or more common voltage plates 206 may operate at a selected voltage. For example, the common voltage plates 206 may operate at a voltage ranging from 0 V to −10 kV. For instance, the common voltage plates 206 may operate at a voltage of −3.5 kV. In another embodiment, the one or more common voltage plates 206 include one or more apertures.

In another embodiment, the one or more electrically-charged plates include one or more increased voltage plates 208. For example, the one or more electrically-charged plates may include an increased voltage plate 208 encompassed by a set of common voltage plates. By way of another example, the increased voltage plate 208 may have an increased voltage relative to the encompassing set of common voltage plates. For instance, the increased voltage plate 208 may have a more negative voltage than the encompassing set of common voltage plates, where negative ions are focused by the multi-beam lens array 110. Alternatively, the increased voltage plate may have a more positive voltage than the encompassing set of common voltage plates, where positive ions are focused by the multi-beam lens array 110. The increased voltage plate 208 may operate at a selected voltage. For example, the increased voltage plate 208 may operate at a voltage ranging from 0 V to −10 kV. For instance, the increased voltage plate 208 may operate at a voltage of −4 kV. In another embodiment, the increased voltage plate 208 includes one or more apertures.

In one embodiment, the one or more primary electron beams 112 are decelerated axially and pushed outward radially when exiting/leaving a first common voltage plate 206 of a set of common voltage plates. In another embodiment, the one or more primary electron beams 112 are decelerated axially and pulled inward radially when entering/approaching an increased voltage plate 208 (e.g. on the uphill potential side of the increased voltage plate 208) encompassed by the set of common voltage plates. In another embodiment, the one or more primary electron beams 112 are accelerated axially and pulled inward radially when exiting/leaving the increased voltage plate 208 (e.g. on the downhill potential side of the increased voltage plate 208). In another embodiment, the one or more primary electron beams 112 are accelerated axially and pushed outward radially when entering/approaching a second common voltage plate 206 of the set of common voltage plates. In this regard, the increased voltage plate 208 focuses the one or more primary electron beams 112, the level of focus being relative to the voltage of the set of increased voltage plates 208.

Although embodiments of the present disclosure are directed to the one or more common voltage plates 206 and the increased voltage plate 208 being plate-like structures with one or more apertures forming the one or more electron-optical pathways 110a, it is noted herein that the one or more common voltage plates 206 and the increased voltage plate 208 may be separate cylindrical structures for a specific electron-optical pathway 110a of the multi-beam lens array 110. Therefore, the above description should not be interpreted as a limitation on the scope of the present disclosure but merely an illustration.

In another embodiment, the one or more array layers include one or more electron-beam stigmators 210 between a set of common voltage plates, where the one or more electron-beam stigmators 210 are configured to reduce the astigmatism observed within the SEM system 100. For example, the one or more electron-beam stigmators 210 may include, but are not limited to, one or more multi-pole beam deflectors 300 for the one or more electron-optical pathways 110a. By way of another example, the one or more electron-beam stigmators 210 may include, but are not limited to, one or more slitted beam stigmators 400, 410 for the one or more electron-optical pathways 110a. In another embodiment, the one or more electron-beam stigmators 210 adjust one or more characteristics (e.g. electron beam 112 position on the sample 120, amount of observed astigmatism, or the like) of the one or more primary electron beams 112. It is noted the multi-pole beam deflector 300 and the one or more slitted beam stigmators 400, 410 are described in detail further herein.

In another embodiment, the top surface of the multi-beam lens array 110 has an electric field generated by the deceleration of the flood electron beam 108 prior to illuminating the top surface of the multi-beam lens array 110. In another embodiment, a bottom surface of the multi-beam lens array 110 has an electric field generated by the acceleration of the one or more primary electron beams 112 after exiting the bottom surface of the multi-beam lens array 110. It is noted herein the generated electric fields allow for focusing of the flood electron beam 108 and the one or more primary electron beams 112, respectively.

In another embodiment, the intermediate image plane 114 is the focal plane for the multi-beam lens array 110. In another embodiment, the amount of focusing of the one or more primary electron beams 112 on the intermediate image plane 114 is dependent on the voltage of the increased voltage plate 208 relative to the encompassing set of common voltage plates.

Although embodiments of the present disclosure are directed to the multi-beam lens array 110 including both an increased voltage plate 208 and one or more electron-beam stigmators 210, it is noted herein the multi-beam lens array 110 may not include the increased voltage plate 208 when including the one or more electron-beam stigmators 210. Therefore, the above description should not be interpreted as a limitation on the scope of the present disclosure but merely an illustration.

Figure 3A:
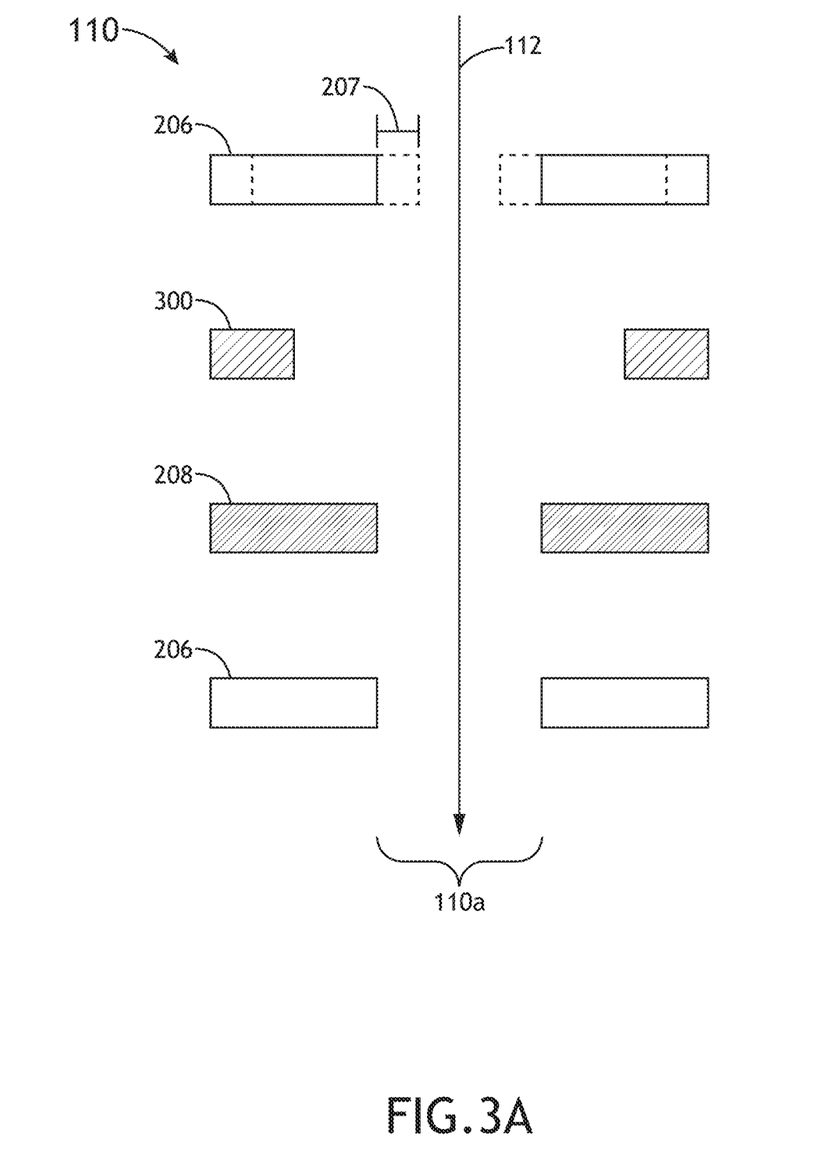
FIG. 3A illustrates a simplified schematic view of an electron-optical pathway of a multi-beam lens array, in accordance with one or more embodiments of the present disclosure.
Figure 3B:
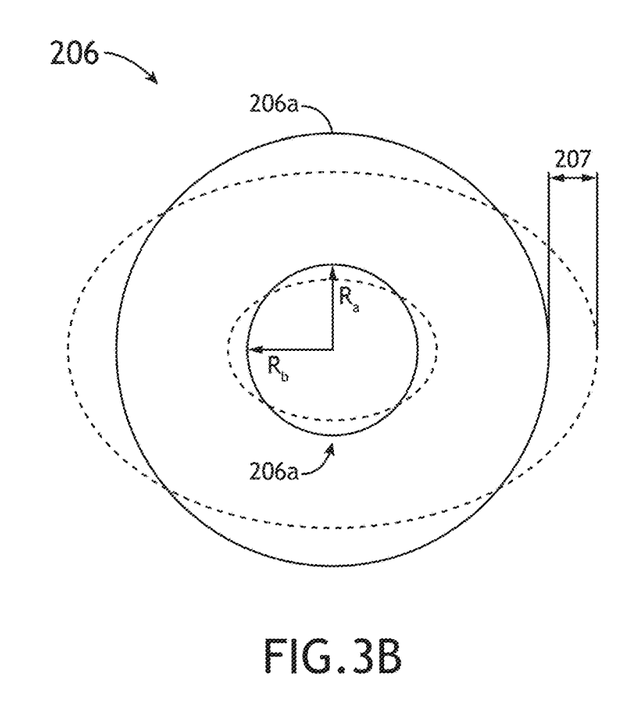
FIG. 3B illustrates a simplified schematic view of aperture shape variance in a multi-beam lens array, in accordance with one or more embodiments of the present disclosure.
Figure 3C:
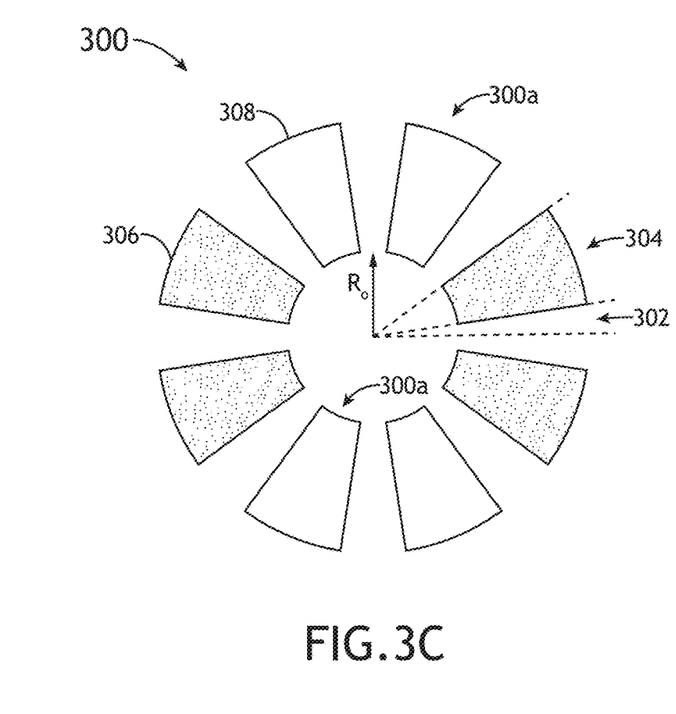
FIG. 3C illustrates a simplified schematic view of a multi-pole beam deflector, in accordance with one or more embodiments of the present disclosure.

FIGS. 3A-3C generally illustrate a simplified schematic view of an electron-optical pathway 110a of the multi-beam lens array 110, in accordance with one or more embodiments of the present disclosure.

In one embodiment, the multi-beam lens array 110 includes a set of common voltage plates including one or more common voltage plates 206. For example, the set may include, but is not limited to, two common voltage plates 206. In another embodiment, the one or more common voltage plates 206 have an aperture 206a with a selected radius $R_a$ and radius $R_b$. In another embodiment, the aperture 206a is round, such that the radius $R_a$ equals the radius $R_b$. For example, the radius $R_a$ and the radius $R_b$ may range from 5-50 micron. For instance, the radius $R_a$ and the radius $R_b$ may be 25 micron. In another embodiment, the aperture 206a is out-of-round an offset amount 207, such that the radius $R_a$ does not equal the radius $R_b$. It is noted herein that astigmatism is introduced into the system when the aperture 206a is out-of-round.

In another embodiment, the set of common voltage plates encompasses an increased voltage plate 208. In another embodiment, the set of common voltage plates 206 encompasses a multi-pole beam deflector 300. The multi-pole beam deflector 300 may be any multi-pole beam deflector known in the art. For example, the multi-pole beam deflector 300 may include, but is not limited to, a quadrupole beam deflector or an octupole beam deflector. In another embodiment, the multi-pole beam deflector 300 has an aperture 300a of a selected radius $R_o$. For example, the radius $R_o$ may range from 5-50 micron. For instance, the radius $R_o$ may be 25 micron. It is noted herein the multi-pole beam deflector 300 may allow for adjustment of the primary electron beam 112 passing through the multi-pole beam deflector 300 to reduce the amount of astigmatism in the SEM system 100.

It is noted herein the stacking order of the increased voltage plate 208 and the multi-pole beam deflector 300 may differ from the stacking order illustrated in FIG. 3A. Therefore, the above description should not be interpreted as a limitation on the scope of the present disclosure but merely an illustration.

In another embodiment, the shape of a pole of the multi-pole beam deflector 300 is defined by an angle 302 and an angle 304, where the angle 302 and the angle 304 are relative to a same plane. In another embodiment, the poles of the multi-pole beam deflector 300 are positive voltage poles 306. In another embodiment, the poles of the multi-pole beam deflector 300 are negative poles 308. It is noted herein that the poles of the multi-pole beam deflector 300 may alternatively be a common ground voltage (e.g. 0 V). It is additionally noted herein the arrangement of the positive voltage poles 306 and the negative voltage poles 308 may differ from that illustrated in FIG. 3C.

The multi-pole beam deflector 300 may be fabricated by any method of fabrication known in the art. For example, the multi-pole beam deflector 300 may be fabricated by any silicon-based micro-fabrication technique or micro-electromechanical system (MEMS) processing technique known in the art. In another embodiment, the multi-pole beam deflector 300 are specific to a particular electron-optical pathway 110a of the multi-beam lens array 110, instead of being coupled to (or fabricated as part of) a plate-like structure. In this regard, the complexity of fabricating the multi-pole beam deflector 300, and subsequently the multi-beam lens array 110, is reduced, as it is not necessary to hold tolerances across a plate-like structure.

It is noted herein that the multi-pole beam deflector 300 may be individually controlled.

Figure 4A:
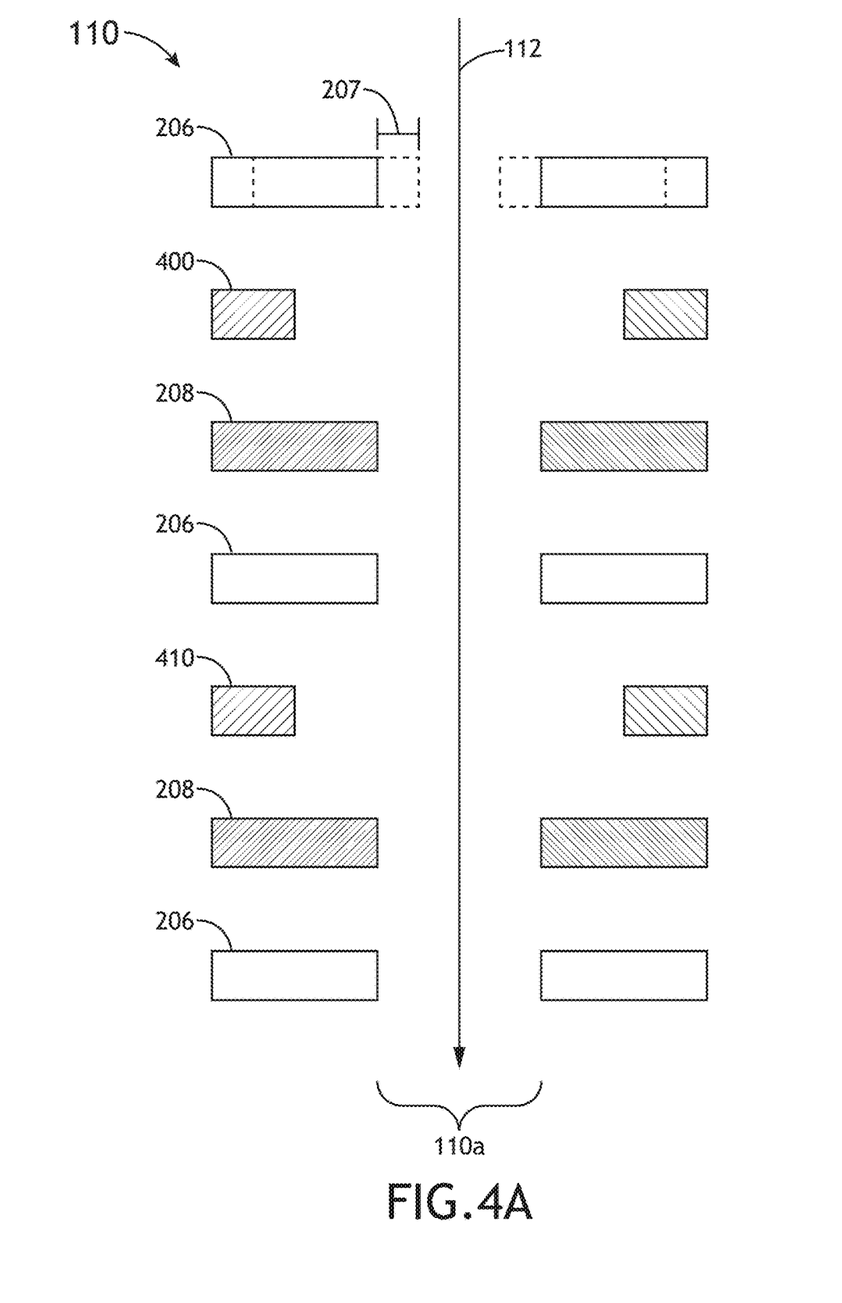
FIG. 4A illustrates a simplified schematic view of an electron-optical pathway of a multi-beam lens array, in accordance with one or more embodiments of the present disclosure.
Figure 4B:
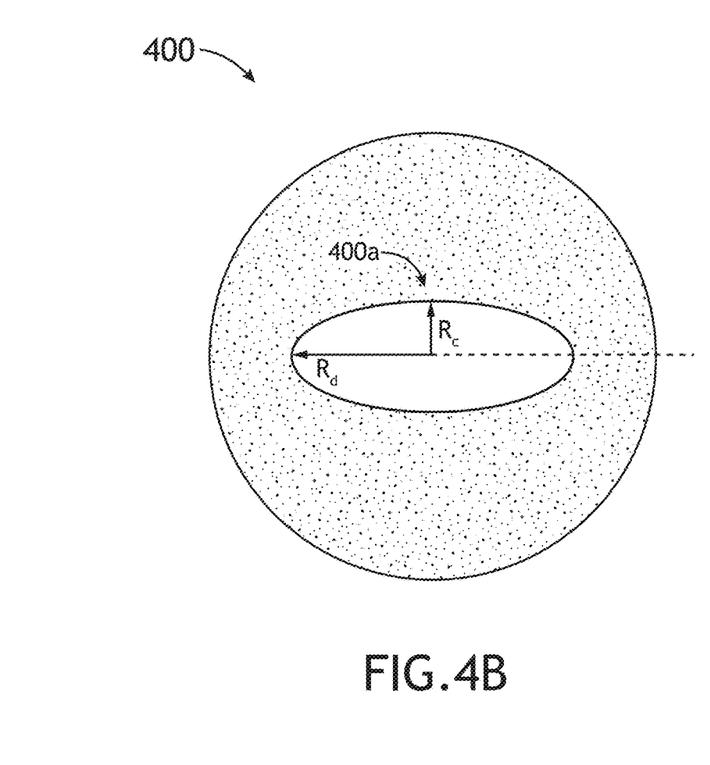
FIG. 4B illustrates a slitted beam stigmator of a multi-beam lens array, in accordance with one or more embodiments of the present disclosure.
Figure 4C:
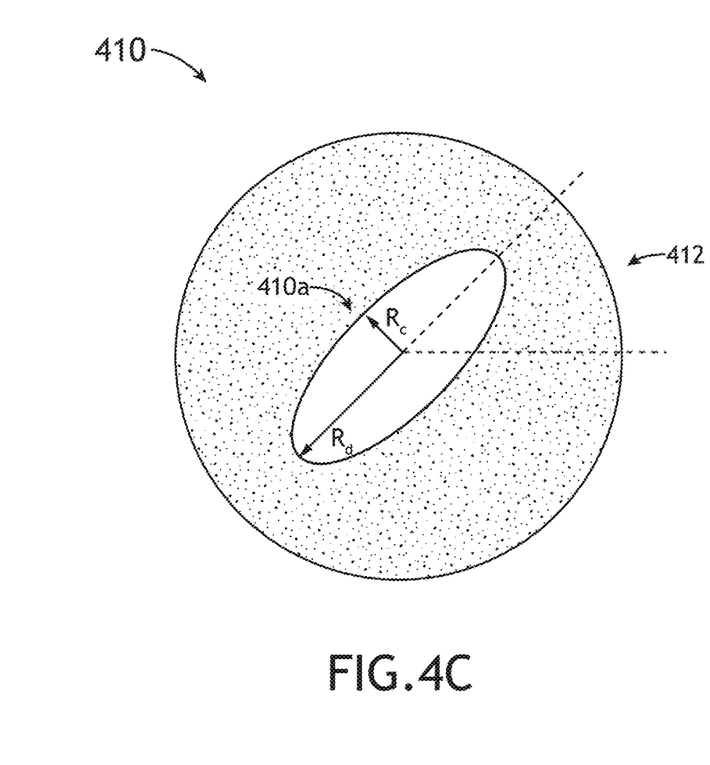
FIG. 4C illustrates a slitted beam stigmator of a multi-beam lens array, in accordance with one or more embodiments of the present disclosure.

FIGS. 4A-4C generally illustrate a simplified schematic view of an electron-optical pathway 110a of the multi-beam lens array 110, in accordance with one or more embodiments of the present disclosure.

In one embodiment, the multi-beam lens array 110 includes two or more sets of common voltage plates, where each set of common voltage plates includes one or more common voltage plates 206. For example, the two or more sets of common voltage plates may each include, but are not limited to, two common voltage plates 206. For instance, as illustrated in FIG. 4A, the two or more sets of common voltage plates may share a common voltage plate 206 (e.g. two sets of common voltage plates have three total common voltage plates 206). Alternatively, the two or more sets of common voltage plates may be separate sets of common voltage plates 206 (e.g. each set of common voltage plates has two common voltage plates 206).

In another embodiment, the two or more sets of common voltage plates each encompass an increased voltage plate 208. In another embodiment, the two or more sets of common voltage plates 206 each encompass a set of slitted beam stigmators 400, 410. For example, as illustrated in FIG. 4A, a first set of common voltage plates 206 may include a first increased voltage plate 208 and a slitted beam stigmator 400, and a second set of common voltage plates 206 may include a second increased voltage plate 208 and a slitted beam stigmator 410.

It is noted herein the stacking order of the increased voltage plate 208 and the slitted beam stigmator 400 or 410 encompassed by the sets of common voltage plates, respectively, may differ from the stacking order illustrated in FIG. 4A. Therefore, the above description should not be interpreted as a limitation on the scope of the present disclosure but merely an illustration.

In another embodiment, the slitted beam stigmator 400 and 410 has an aperture 400a and an aperture 410a, respectively. For example, the apertures 400a and 410a may be elliptic in shape, with a selected radius $R_c$ and radius $R_d$. In another embodiment, the aperture 410a of the slitted beam stigmator 410 is orientated at a selected offset angle 412 relative to the aperture 400a of the slitted beam stigmator 400. For example, the offset angle 412 may range from 0 to 90 degrees. For instance, the offset angle 412 may be 45 degrees. It is noted herein orienting the aperture 410a at the offset angle 412 from the aperture 400a may reduce the amount of astigmatism in the SEM system 100.

In another embodiment, the slitted beam stigmator 400 and the slitted beam stigmators 410 form a set of slitted beam stigmators. It is noted herein that the electron-optical pathways 110a may include a set of slitted beam stigmators with an offset angle 412 between apertures 400a, 410a that differs from an offset angle 412 between apertures 400a, 410a in other sets of slitted beam stigmators in other electron-optical pathways 110a.

In another embodiment, a single set of slitted beam stigmators reduces astigmatism in the SEM system 100 along one optical axis. In this regard, correcting for astigmatism along multiple axes would require multiple sets of slitted beam stigmators (and additional corresponding layers of common ground voltage plates 206 and increased voltage plates 208).

The slitted beam stigmators 400, 410 may be fabricated by any method of fabrication known in the art. For example, the slitted beam stigmators 400, 410 may be fabricated by any silicon-based micro-fabrication technique or microelectromechanical system (MEMS) processing technique known in the art. In another embodiment, a set of slitted beam stigmators 400, 410 is specific to a particular electron-optical pathway 110a of the multi-beam lens array 110, instead of being coupled to (or fabricated as part of) a plate-like structure. In this regard, the complexity of fabricating the slitted beam stigmators 400, 410, and subsequently the multi-beam lens array 110, is reduced, as it is not necessary to hold tolerances across a plate-like structure.

Figure 5:
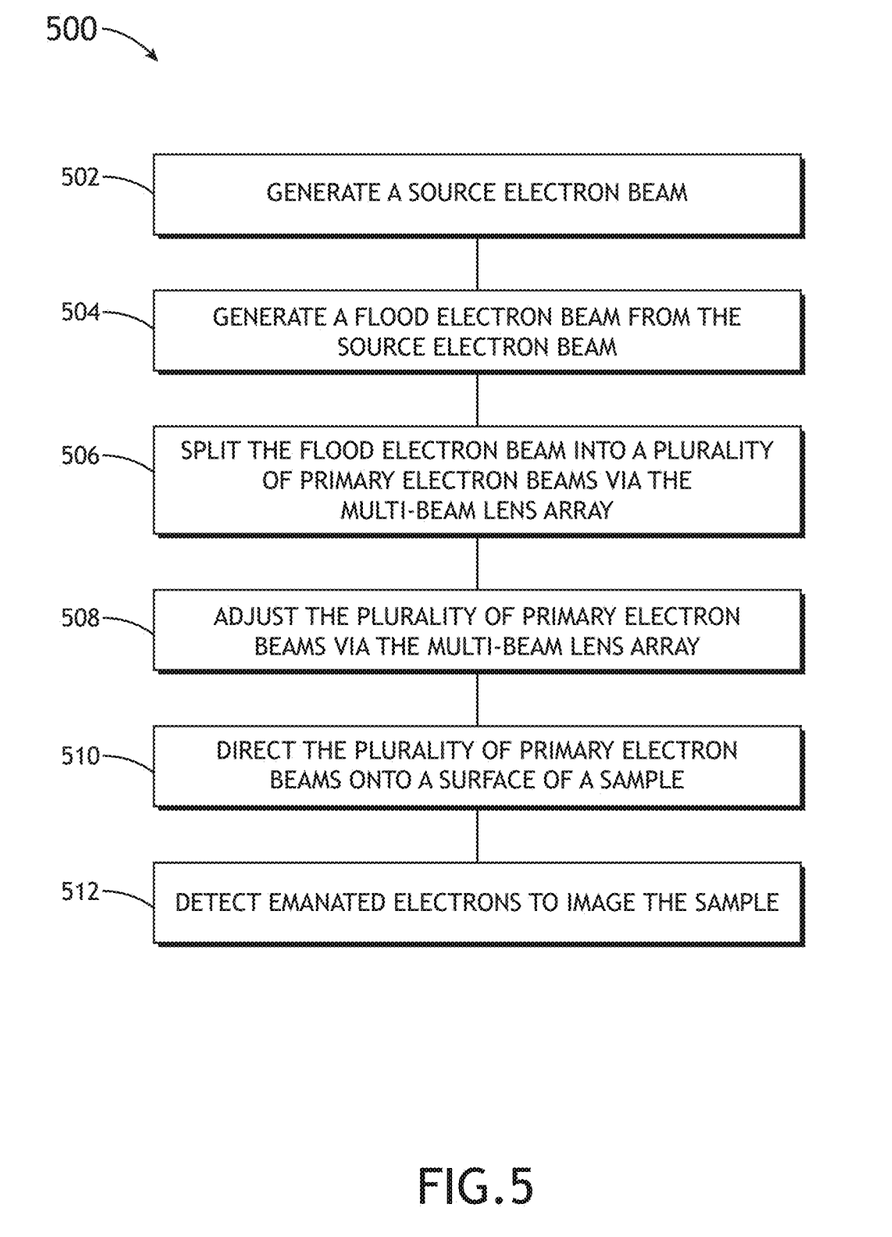
FIG. 5 is a process flow diagram illustrating a method for scanning a surface of a sample via a multi-beam scanning electron microscopy (SEM) system, in accordance with one or more embodiments of the present disclosure.

FIG. 5 illustrates a process flow diagram depicting a method 500 for scanning a surface of the sample 120 via a multi-beam scanning electron microscopy (SEM) system 100, in accordance with one or more embodiments of the present disclosure. It is noted herein that the steps of method 500 may be implemented all or in part by the system 100. It is recognized, however, that the method 500 is not limited to the system 100 in that additional or alternative system-level embodiments may carry out all or part of the steps of method 500.

In a step 502, the source electron beam 104 is generated. In one embodiment, the source electron beam 104 is generated by the electron beam source 102. In another embodiment, the electron beam source 102 includes the electron emitter 200. In another embodiment, the electron beam source 102 includes the extractor 202. In another embodiment, the electron beam source 102 includes the anode 204. In another embodiment, the electron beam source 102 directs the source electron beam 104 to the set of electron-optical elements 106.

In a step 504, the flood electron beam 108 is generated from the source electron beam 104 via the set of electron-optical elements 106. In one embodiment, the set of electron-optical elements 106 widens the source electron beam 104 to generate the flood electron beam 108. In another embodiment, the set of electron-optical elements 106 directs the flood electron beam 108 to the multi-beam lens array 110. In another embodiment, the flood electron beam 108 illuminates the top surface of the multi-beam lens array 110.

In a step 506, the flood electron beam 108 is split into one or more primary electron beams 112 via the multi-beam lens array 110. In one embodiment, the multi-beam lens array includes one or more array layers. In another embodiment, one or more array layers include one or more sets of apertures. In another embodiment, one or more electron-optical pathways 110a are formed by aligning the one or more sets of apertures. In another embodiment, the flood electron beam 108 is directed through the one or more electron-optical pathways 110a. In this regard, the multi-beam lens array 110 splits the flood electron beam 108 into the one or more primary electron beams 112. In another embodiment, one or more sets of aperture lenses and/or micro-lenses are inset within the one or more sets of apertures.

In a step 508, the one or more primary electron beams 112 are adjusted via the multi-beam lens array 110. In one embodiment, the one or more array layers include one or more electrically-charged plates. For example, the one or more electrically-charged plates may include, but are not limited to, the one or more common voltage plates 206. For instance, the one or more common voltage plates may be grouped into sets of common voltage plates. By way of another example, the one or more electrically-charged plates may include, but are not limited to, the increased voltage plate 208 encompassed by a set of common voltage plates. In another embodiment, the increased voltage plate 208 focuses the one or more primary electron beams 112 onto the intermediate image plane 114, where the amount of focus is dependent on the voltage of the increased voltage plate 208 relative to the voltage of the encompassing set of common voltage plates.

In another embodiment, the one or more array layers include one or more separate electron-beam stigmators 210. For example, the one or more electron-beam stigmators 210 may include, but are not limited to, one or more multi-pole beam deflectors 300. For instance, the one or more multi-pole beam deflectors 300 may include, but are not limited to, one or more quadrupole beam deflectors and/or one or more octupole beam deflectors. By way of another example, the one or more electron-beam stigmators 210 may include, but are not limited to, one or more sets of slitted beam stigmators 400, 410. For example, the one or more sets of slitted beam stigmators 400, 410 may include apertures 400a, 410a, respectively, where the aperture 410a is orientated at a selected offset angle 412 from the aperture 400a. In another embodiment, the one or more electron-beam stigmators 210 adjust one or more characteristics (e.g. primary electron beam 112 position on the sample 120, amount of lens field astigmatism, or the like) of the one or more primary electron beams 112.

In a step 510, the one or more primary electron beams 112 are directed onto a surface of the sample 120. In one embodiment, the one or more primary electron beams 112 are directed through the intermediate image plane 114 and the set of electron-optical elements 116 prior to hitting the surface of the sample 120.

In a step 512, electrons 124 emanated from the surface of the sample 120 are detected to image the sample 120. For example, the electrons 124 may include, but are not limited to, secondary electrons and/or backscattered electrons. In one embodiment, the secondary electrons are imaged via the detector array 128 including one or more secondary electron detector assemblies. In another embodiment, the secondary electrons are directed towards the detector array 128 via the deflector assembly 122 and the set of electron-optical elements 126.

In another embodiment, backscattered electrons are detected to image the sample via a detector array 128 including one or more backscattered electron detector assemblies. In another embodiment, the detector array 128 is located within the electron-optical pathways of the one or more primary electron beams 112, such that the deflector assembly 122 does not direct the backscattered electrons.

Advantages of the present disclosure include correcting for array astigmatism in a multi-beam lens array. Advantages of the present disclosure also include reducing the complexity of fabricating the multi-beam lens array.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B.

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed:

1. A multi-beam scanning electron microscopy (SEM) system, comprising:
    an electron beam source configured to generate a source electron beam;
    a first set of electron-optical elements configured to generate a flood electron beam from the source electron beam;
    a multi-beam lens array, comprising:
        a plurality of electron-optical pathways configured to split the flood electron beam into a plurality of primary electron beams; and
        a plurality of electrically-chargeable array layers configured to adjust at least some of the plurality of primary electron beams, wherein the plurality of electrically-chargeable array layers comprise:
            a set of common voltage plates including a first common voltage plate with a first set of apertures and a second common voltage plate with a second set of apertures, wherein at least one of an aperture of the first set of apertures or an aperture of the second set of apertures includes a first radius and a second radius, wherein the first radius and the second radius are different;
            a focusing voltage plate including a third set of apertures; and
            one or more multi-pole beam deflectors configured to adjust astigmatism within the multi-beam lens array,
            wherein at least one of a voltage of the focusing voltage plate or a voltage of the one or more multi-pole beam deflectors is independently adjustable relative to a voltage of the set of common voltage plates;
    a second set of electron-optical elements configured to direct at least some of the plurality of primary electron beams onto a surface of a sample;
    a stage configured to secure the sample; and
    a detector array configured to detect a plurality of electrons emanated from the surface of the sample in response to the plurality of primary electron beams.

2. The system in claim 1, wherein the electron beam source comprises:
    an electron emitter, an extractor, and an anode.

3. The system in claim 1, wherein the first set of electron-optical elements is configured to direct the flood electron beam to the multi-beam lens array.

4. The system in claim 1, wherein an electron-optical pathway of the plurality of electron-optical pathways includes an aperture of the first set of apertures, an aperture of the second set of apertures, a multi-pole beam deflector of the one or more multi-pole beam deflectors, and an aperture of the third set of apertures.

5. The system in claim 1, wherein a difference between the first radius and the second radius introduces the astigmatism into the electron-optical pathway.

6. The system in claim 5, wherein the multi-pole beam deflector reduces the astigmatism introduced into the electron-optical pathway by adjusting the primary electron beam.

7. The system in claim 1, wherein the one or more multi-pole beam deflectors are positioned between the focusing voltage plate and the second common voltage plate.

8. The system in claim 1, wherein the one or more multi-pole beam deflectors include at least one of one or more quadrupole beam deflectors or one or more octupole beam deflectors.

9. The system in claim 1, wherein the one or more emanated electrons include one or more secondary electrons, wherein the detector array includes one or more secondary electron detector assemblies.

10. The system in claim 9, further comprising:
    a deflector assembly configured to deflect the one or more secondary electrons to the detector array via a third set of electron-optical elements.

11. An apparatus for correcting arrayed astigmatism in a multi-beam scanning electron microscopy (SEM) system, comprising:
    a plurality of electron-optical pathways configured to split a flood electron beam to generate a plurality of primary electron beams, wherein the flood electron beam is generated via a first set of electron-optical elements from a source electron beam, wherein the source electron beam is generated via an electron beam source; and
    a plurality of electrically-chargeable array layers configured to adjust at least some of the plurality of primary electron beams, wherein the plurality of electrically-chargeable array layers comprise:
        a set of common voltage plates including a first common voltage plate with a first set of apertures and a second common voltage plate with a second set of apertures, wherein at least one of an aperture of the first set of apertures or an aperture of the second set of apertures includes a first radius and a second radius, wherein the first radius and the second radius are different;
        a focusing voltage plate including a third set of apertures; and one or more multi-pole beam deflectors configured to adjust astigmatism within the multi-beam lens array,
wherein at least one of a voltage of the focusing voltage plate or a voltage of the one or more multi-pole beam deflectors is independently adjustable relative to a voltage of the set of common voltage plates,
wherein at least some of the plurality of primary electron beams are directed onto a surface of a sample via a second set of electron-optical elements, wherein a plurality of electrons emanate from the surface of the sample in response to the plurality of primary electron beams, wherein the plurality of electrons are detected by a detector array.

12. A method, comprising:
generating a source electron beam;
generating a flood electron beam from the source electron beam via a first set of electron-optical elements;
splitting the flood electron beam to generate a plurality of primary electron beams via a multi-beam lens array;
adjusting at least some of the plurality of primary electron beams via the multi-beam lens array, wherein the multi-beam lens array includes a plurality of electrically-chargeable array layers configured to adjust at least some of the plurality of primary electron beams, wherein the plurality of electrically-chargeable array layers comprise:
a set of common voltage plates including a first common voltage plate with a first set of apertures and a second common voltage plate with a second set of apertures;
a focusing voltage plate including a third set of apertures; and
one or more multi-pole beam deflectors configured to adjust astigmatism within the multi-beam lens array,
wherein at least one of a voltage of the focusing voltage plate or a voltage of the one or more multi-pole beam deflectors is independently adjustable relative to a voltage of the set of common voltage plates;
directing at least some of the plurality of primary electron beams through a second set of electron-optical elements onto a surface of a sample; and
detecting a plurality of electrons emanated from the surface of the sample in response to the plurality of primary electron beams.

* * * * *

UNITED STATES PATENT AND TRADEMARK OFFICE
CERTIFICATE OF CORRECTION

| | | |
|---|---|---|
| PATENT NO. | : 10,497,536 B2 | Page 1 of 1 |
| APPLICATION NO. | : 15/645863 | |
| DATED | : December 3, 2019 | |
| INVENTOR(S) | : Alan D. Brodie | |

It is certified that error appears in the above-identified patent and that said Letters Patent is hereby corrected as shown below:

On the Title Page

Column 1, Item (73) Assignee should read:
--KLA-TENCOR CORPORATION, Milpitas, CA (US)--

Signed and Sealed this
Twenty-third Day of June, 2020

Andrei Iancu
*Director of the United States Patent and Trademark Office*